United States Patent
Li (12)

(10) Patent No.: US 11,201,582 B2
(45) Date of Patent: Dec. 14, 2021

(54) TRACKING TYPE PORTABLE THIN-FILM SOLAR POWER GENERATING DEVICE

(71) Applicant: Jie Li, Guangxi (CN)

(72) Inventor: Jie Li, Guangxi (CN)

(*) Notice: Subject to any disclaimer, the term of this patent is extended or adjusted under 35 U.S.C. 154(b) by 0 days.

(21) Appl. No.: 16/808,382

(22) Filed: Mar. 4, 2020

(65) Prior Publication Data

US 2020/0204107 A1 Jun. 25, 2020

Related U.S. Application Data

(63) Continuation of application No. PCT/CN2019/083973, filed on Apr. 24, 2019.

(30) Foreign Application Priority Data

Jun. 10, 2018 (CN) .......................... 201810591528.9

(51) Int. Cl.
*H02S 20/32* (2014.01)
*H02S 30/10* (2014.01)
*H02S 30/20* (2014.01)
*H01L 31/046* (2014.01)

(52) U.S. Cl.
CPC ............ *H02S 20/32* (2014.12); *H01L 31/046* (2014.12); *H02S 30/10* (2014.12); *H02S 30/20* (2014.12)

(58) Field of Classification Search
CPC .......... H02S 30/10; H02S 30/20; H02S 20/32; H01L 31/046
See application file for complete search history.

(56) References Cited

U.S. PATENT DOCUMENTS

| | | | | |
|---|---|---|---|---|
| 5,520,747 A | * | 5/1996 | Marks | H01L 31/0547 136/245 |
| 6,423,895 B1 | * | 7/2002 | Murphy | H02S 30/20 136/245 |
| 6,870,087 B1 | * | 3/2005 | Gallagher | F24S 30/425 136/246 |
| 7,554,030 B2 | * | 6/2009 | Shingleton | H02S 20/32 136/246 |
| 7,888,588 B2 | * | 2/2011 | Shingleton | F24S 30/425 136/246 |
| 2004/0238025 A1 | * | 12/2004 | Shingleton | H02S 20/10 136/246 |
| 2009/0235975 A1 | * | 9/2009 | Shingleton | F24S 50/20 136/246 |

(Continued)

*Primary Examiner* — Golam Mowla

(57) ABSTRACT

The present invention relates to new energy field, and more particularly to a tracking type portable thin-film solar power generating device. Conventionally, commercially available thin-film solar power generation devices have a fixed inclination angle and do not have a tracking function, which results in a low power generation capacity. Therefore, it is difficult to satisfy the needs of outdoor activities. Since photoelectric conversion rate is difficult to be effective improved in the short-term, how to increase the power generation of thin-film solar cells has become an urgent technical problem in the field of thin-film solar power generation. The present invention uses folded type and assembled type thin-film solar cells, articulated devices, and a driving device to form a movable support, so that an inclination angle of an integrated polygonal thin-film solar cell can be changed with time for tracking the sun.

4 Claims, 3 Drawing Sheets

(56) References Cited

U.S. PATENT DOCUMENTS

| | | | | |
|---|---|---|---|---|
| 2011/0120523 A1* | 5/2011 | Silver | ............ | H02S 20/32 |
| | | | | 136/246 |
| 2013/0340807 A1* | 12/2013 | Gerwing | ............ | H01L 31/02 |
| | | | | 136/246 |
| 2014/0283894 A1* | 9/2014 | Silver | ............ | H02S 20/32 |
| | | | | 136/246 |
| 2016/0020724 A1* | 1/2016 | Remy | ............ | F24S 25/12 |
| | | | | 136/246 |

* cited by examiner

TRACKING TYPE PORTABLE THIN-FILM SOLAR POWER GENERATING DEVICE

CROSS REFERENCE OF RELATED APPLICATION

This is a Continuation Application of the International Application PCT/CN2019/083973, filed Apr. 24, 2019, which claims priority under 35 U.S.C. 119(a-d) to CN 201810591528.9, filed Jun. 10, 2018.

BACKGROUND OF THE PRESENT INVENTION

Field of Invention

The present invention relates to new energy field, and more particularly to a to tracking type portable thin-film solar power generating device.

Description of Related Arts

Conventionally, commercially available thin-film solar power generation devices have a fixed inclination angle and do not have a tracking function, which results in a low power generation capacity. Furthermore, with a small installed capacity, it is difficult to satisfy the needs of outdoor activities. Since photoelectric conversion rate is difficult to be effective improved in the short-term, how to increase the power generation of thin-film solar cells has become an urgent technical problem in the field of thin-film solar power generation.

Technical Problem to be Solved

Since photoelectric conversion rate is difficult to be effective improved in the short-term, how to increase the power generation of thin-film solar cells has become an urgent technical problem for outdoor solar power generation.

SUMMARY OF THE PRESENT INVENTION

An object of the present invention is to provide a tracking type portable thin-film solar power generating device to overcome the above defects.

Accordingly, in order to accomplish the above objects, the present invention provides:

A tracking type portable thin-film solar power generating device, comprising: a movable support or a pillar, thin-film solar cells, a driving device, and hollow tubes; wherein the tracking type portable thin-film solar power generating device is a folded type thin-film solar power generating device or an assembled type thin-film solar power generating device; wherein the folded type thin-film solar power generating device divides a piece of portable foldable textile fabric with high temperature resistance, water resistance and corrosion resistance into M polygonal or circular grids, and each grids are provided with one of the thin-film solar cells; the M thin-film solar cells are connected in series or in parallel to form an integrated polygonal thin-film solar cell; wherein the assembled type thin-film solar power generation device is in a scroll state when in store; after the assembled type thin-film solar power generation device is expanded, F thin-film solar cells are assembled with each other to form a polygonal shape; the F thin-film solar cells are connected in series or in parallel to form an integrated polygonal thin-film solar cell; for the folded type or the assembled type thin-film solar power generating device, on a back side of the fabric, strip-like or button-like pockets or touch fasteners are sewn on edges of the fabric, and a length of each of the pockets or touch fasteners on the edges is consistent with an edge length; two strip-like or button-like pockets or touch fasteners are sewn in two diagonal directions; N strip-like or button-like pockets or touch fasteners are sewed in a latitudinal direction and a longitudinal direction, which are arranged in the latitudinal direction or the longitudinal direction from a center intersection thereof; a length of each of the strip-like or button-like pockets or touch fasteners in the latitudinal direction or the longitudinal direction is consistent with a corresponding edge length in the latitudinal direction or the longitudinal direction; lengths of the pockets or touch fasteners in the diagonal directions stop at adjacent pockets or touch fasteners of a middle pocket or touch fastener in the latitudinal direction or stop at corners of frames; there is no diagonal pockets in a movable support mode; for the assembled type thin-film solar power generating device, internal edges of two external thin-film solar cells in the longitudinal direction, which face other thin-film solar cells, are one of a male side or a female side of the touch fasteners; two edges of the other thin-film solar cells are one of the male side and the female sides of the touch fasteners; wherein the button-like pockets or touch fasteners have gaps between adjacent pockets or touch fasteners; the adjacent pockets or touch fasteners are not connected into a strip but are evenly distributed along an edge length direction; each end of the strip-like pockets has an opening; R hollow tubes are inserted into each of the strip-like or button-like pockets or touch fasteners; a cross section of the hollow tubes is circular or polygonal; both ends of the hollow tubes are bolt joints or nut joints, or one end is a bolt joint and the other end is a nut joint; when $R>1$, the R hollow tubes inserted to the strip-like or button-like pockets or touch fasteners are threaded together to form hollow tubes with a same length as the edges or diagonals; the hollow tubes of each frame are threaded together through connecting nuts; the connecting nuts comprises L-shaped nuts at corner joints and T-shaped nuts at linear joints; in the folded type or the assembled type thin-film solar power generating device, each of the hollow tubes at each frame has an opening between two ends; there are totally H joints for four frames, and the joints comprises penetrating joints and non-penetrating joints; if a joint of adjacent long and short edges in a southeast corner of the frames is a penetrating joint, then a joint of adjacent long and short edges in a northwest corner of the frames is a non-penetrating joint, and vice versa; in the folded type or the assembled type thin-film solar power generating device, after the hollow tubes on the back side of the fabric are bolted at intersections, one ends of the hollow tubes are inserted into the non-penetrating joints, and the other ends of the hollow tubes are inserted into the penetrating joints, so as to be bolted or threaded as well as integrated with the hollow tubes of the frames; wherein at the T-shaped nuts, the hollow tubes pass through the strip-like or button-like pockets or touch fasteners and threaded with vertical joints of the T-shaped nuts; in an independent pillar support mode of the folded type or the assembled type thin-film solar power generating device, a joint is provided at a middle of a hollow tube on an east side frame or a west side frame, or at a bottom of the T-shaped nut; a component of an articulated device is movably installed on the joint, which is articulated with a component of the articulated device at a top of the driving device to complete the articulated device; the hollow tubes at the two diagonals are bolted and integrated at an intersection; a bolt at the intersection articulates the pillar to form an articulated device, thereby mounting the integrated polygonal thin-film solar cell on the pillar; in the movable support mode of the folded type or the assembled type thin-film solar power generating device, referring to an intersection of diagonals of the integrated polygonal thin-film solar cell in the latitudinal direction and the longitudinal direction, three hollow tubes with a same length as the long edge of the frames are installed at the intersection and left and right adjacent sides thereof; a top end of a T-shaped component, which has an open ring at a bottom end, straddles and bolts with the three hollow tubes; the open ring at the bottom end of the T-shaped component covers and is bolted on a rotating shaft of a power box to fix the integrated polygonal thin-film solar cell on the rotating shaft; the driving device for driving the rotating shaft is installed in the power box; both ends of the hollow tubes are the bolt joints or the nut joints, or one end is the bolt joint and the other end is the nut joint; the driving device adjusts an inclination angle of the thin-film solar cells according to change of time; in the independent pillar support mode, the driving device uses an intelligent electric telescopic support rod for adjustment; in the movable support mode, the driving device uses a driving motor together with a transmission mechanism for adjustment; wherein the two support modes are adopted for different combination of the thin-film solar cells and the driving device, which jointly construct a simple and portable solar power generating device with a sun-tracking function; according to the different support modes, the driving device of different types is used to drive the thin-film solar cells according to a time control method, so as to change the inclination angle according to the time control method. An intelligent electric telescopic rod device in the driving device comprises two types according to different transmission mechanisms; in a first type, the driving motor and the intelligent electric telescopic support rod are installed perpendicularly, and a worm gear is used as the transmission mechanism; in a second type, the driving motor and the intelligent electric telescopic support rod are installed parallelly, and a gear, a driving wheel or a belt is used as the transmission mechanism; internal structures of the first type and the second type of the intelligent electric telescopic rod device are identical except for the transmission mechanism; wherein the intelligent electric telescopic rod device comprises a base, the driving motor, the transmission mechanism, an angular contact bearing, a nut, a threaded screw rod, an inner sleeve, and an outer sleeve, wherein one end of the transmission mechanism is connected to the driving motor, and the other end of the transmission mechanism is connected to one end of the threaded screw rod; the outer sleeve and the angular contact bearing are fixed on the support or the base; the transmission mechanism is fixed in the base or the support; the driving motor is installed outside the outer sleeve and is parallel or perpendicular to the outer sleeve; the threaded screw rod passes through the angular contact bearing, and a bottom end of the threaded screw rod is connected to the transmission mechanism; the nut is sleeved on the threaded screw rod; a rod body of the intelligent electric telescope support rod is formed by the inner sleeve with a same diameter and an accompanying socket; the inner sleeve is sleeved on the threaded screw rod, and the socket on a bottom of the inner sleeve is integrated with the nut to form a combination consisting of the inner sleeve with the same diameter, the threaded screw rod with the same diameter, and the nut; the threaded screw rod with the same diameter inside the rod body is precisely fitted together with the rod body through the nut and the socket, so as to rotate freely in the rod body to form a threaded motion pair; during working, the driving motor drives the transmission mechanism, thereby driving the threaded screw rod to synchronically rotate; rotary motion of the threaded screw rod is converted to linear motion of the rod body through the nut and socket, so as to extend and shorten the intelligent electric telescope support rod. The power box has a groove, and sliding bearings are installed on both sides of the groove; the rotating shaft is installed in a middle of the groove and is supported by the sliding bearings on both sides; one end of the rotating shaft passes through the sliding bearings and is connected to the transmission mechanism in the driving device; the sliding bearings are fixed on a bracket in a box body of the power box; E holes are preset on a periphery of a bottom plate protruding from a bottom of the box body; each of the holes is bolted above a polygonal or circular support plate; a shell of the power box is equipped with a USE interface, output and input power interfaces and an LED light. According to the time control method, the driving device intelligently drives the thin-film solar cells to rotate 1-dimensionally from east to west according to the change of time, thereby adjusting the inclination angle of the thin-film solar cells according to the change of time; the inclination angle of the thin-film solar cells is adjusted three times a day, and adjustment is divided into three states; a first stage adjusts the thin-film solar cells to the east in morning, a second stage adjusts the thin-film solar cells to be horizontal at noon, and a third stage adjusts the thin-film solar cells to the west in afternoon; in the independent pillar support mode, the inclination angle is adjusted by the intelligent electric telescopic support rod; in the movable support mode, the inclination angle is adjusted by the driving device in the power box.

DETAILED DESCRIPTION OF THE PREFERRED EMBODIMENT

Preferred Embodiment of the Present Invention

Figure 1:
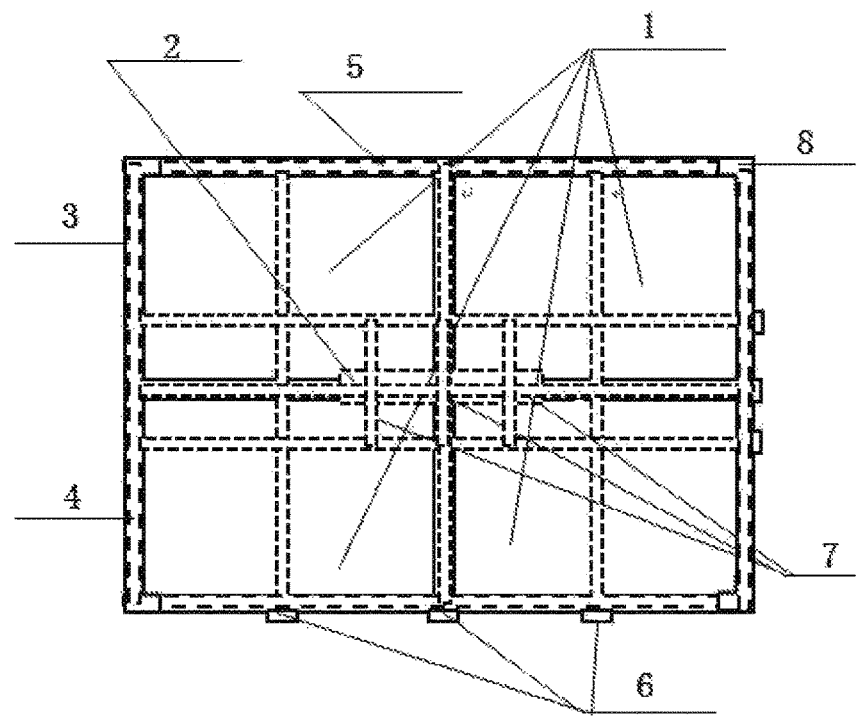
FIG. 1 is a top plan view of a folded type movable support mode where a framework of thin-film solar cells is removed, wherein: 1—thin-film solar cell, 2—power box, 3—strip-like or button-like pocket or touch fastener, 4—short edge hollow tube, 5—long edge hollow tube, 6—nut for fixing internal hollow tubes to frames, 7—T-shaped component having an open ring at a bottom end, and 8—L-shaped connecting nut.
Figure 2:
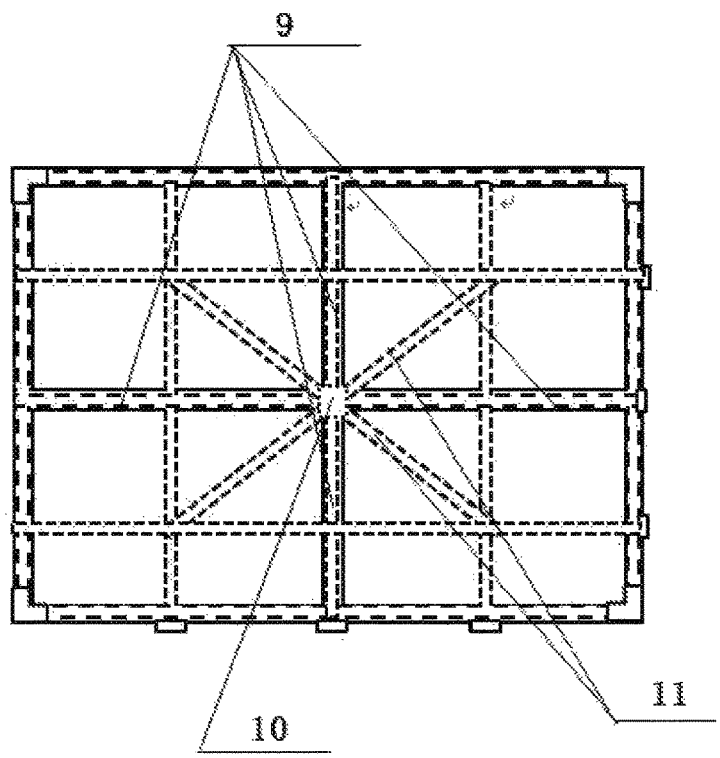
FIG. 2 is a top plan view of a folded type independent pillar support mode where the framework of the thin-film solar cells is removed, wherein: 9—folding seam of a textile fabric, 10—articulated device on an independent pillar, and 11—diagonal hollow tube.
Figure 3:
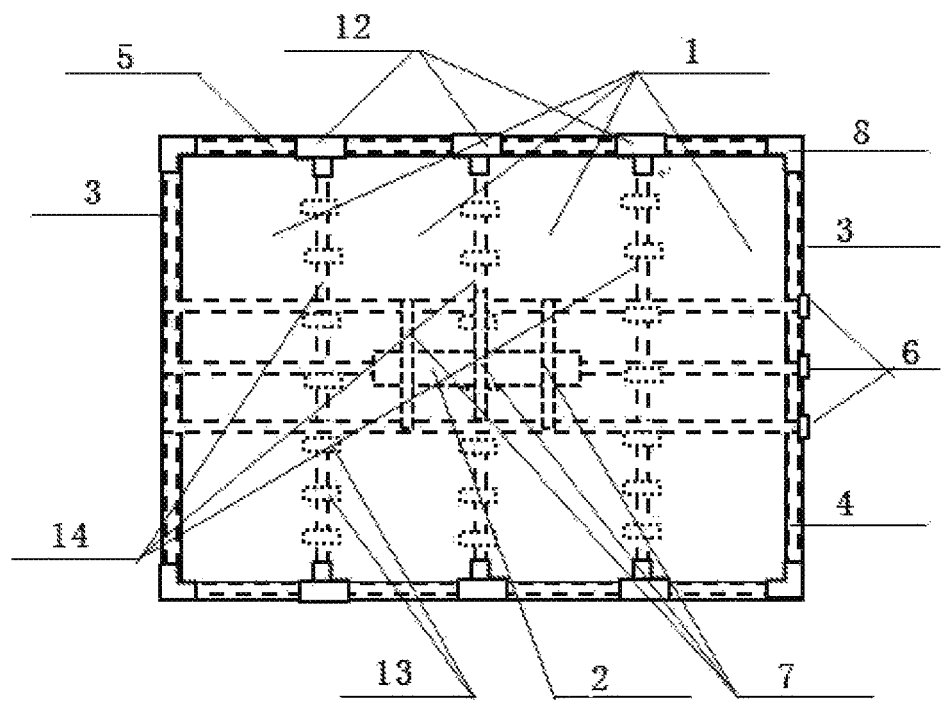
FIG. 3 is a top plan view of an assembled type movable support mode of the thin-film solar cells, wherein: 12—T-shaped connecting nut, 13—button-like pocket or touch fastener, and 14—internal short side hollow tube.
Figure 4:
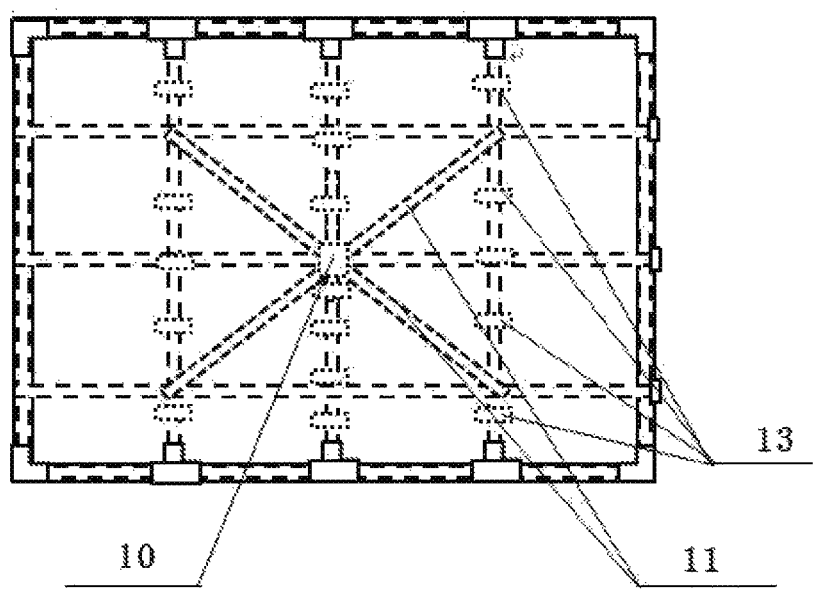
FIG. 4 is a top plan view of an assembled type independent pillar support mode of the thin-film solar cells.
Figure 5:
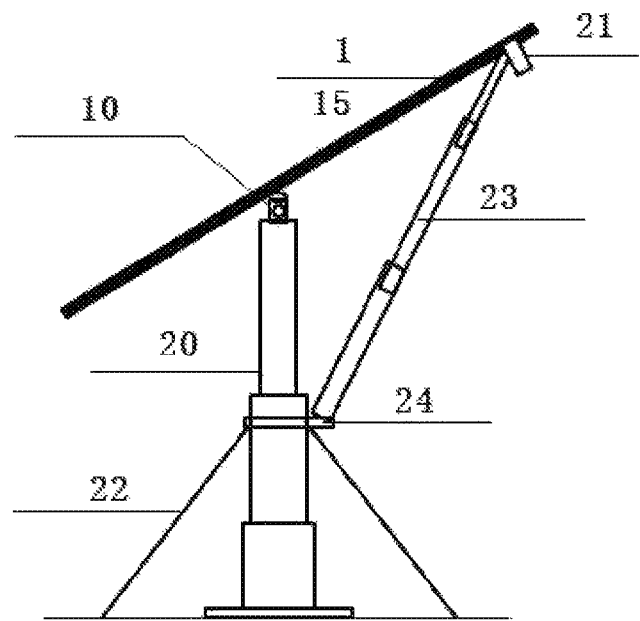
FIG. 5 is a side view of an independent pillar support mode of the thin-film solar cells, wherein: 20—independent pillar, 21—articulated device on an intelligent electric telescopic support rod, 22—fixed chain, 23—intelligent electric telescopic support rod, and 24—hoop.
Figure 6:
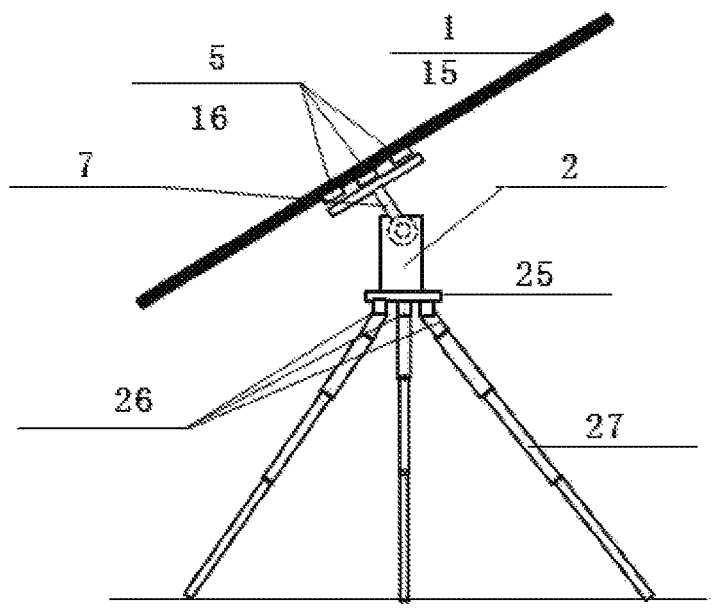
FIG. 6 is a side view of a movable support mode of the thin-film solar cells, wherein: 25—polygonal or circular support plate, 26—L-shaped nut with an included angle greater than 90 degrees, and 27—triangular support frame of a movable support.

Referring to FIGS. 1-6, FIGS. 1 and 2 are top plan views of a folded type thin-film solar power generating device, wherein FIG. 1 refers to a movable support mode and FIG. 2 refers to an independent pillar support mode. In both modes, storage and installation of the foldable thin-film solar cells in the generating device are the same, but connections between a driving device and a support are different. When in store, the thin-film solar cells 1 are folded according to folding seams 9 of a textile fabric to form a polygonal or circular shape. When in use, short edge hollow tubes 4 and long edge hollow tubes 5 are inserted into strip-like pockets 3 at four edges, and four frames are integrated with L-shaped connecting nut 8 at corners. When R>1, linear connections of the hollow tubes 5 are integrated with T-shaped nuts. On a back side of the textile fabric, hollow tubes are inserted into the strip-like or button-like pockets or touch fasteners 3 in a latitudinal direction and a longitudinal direction, and two ends of each hollow tubes are bolted with middles of the short edge hollow tubes 4 and the long edge hollow tubes 5 through nuts 6. Each of the touch fasteners has a male side and a female side: one is made of soft fibers, and the other is made of stabbed elastic fibers. In the movable support mode, three hollow tubes with a same length as long frames are installed at a middle of a center hollow tube in the longitudinal direction and the adjacent left and right sides thereof, and two ends of each of the three hollow tubes are inserted into short frames, wherein the end that is inserted into a penetrating joint of the short frame is fixed on the short frame with the nut 6. T-shaped component 7 having an open ring at a bottom end, which is connected by three bolts, straddles the three hollow tubes. A triangular support frame 27 is integrated with a polygonal or circular support plate 25 through a L-shaped nut 26. A power box 2 is placed and fixed on the support plate 25 by bolting. Then, the open ring of the T-shaped component 7 is bolted to a rotating shaft of the power box 2. A driving motor is powered by an energy storage battery in the power box 2, and then the thin-film solar power generating device in the movable support mode is installed, as shown in FIG. 1. In the independent pillar support mode, the diagonal hollow tubes 11 pass through the strip-like pockets or button-like pockets or touch fasteners 3, and are bolted at an intersection to form a component of an articulated device. Two ends of each diagonal hollow tube 11 are bolted to the internal hollow tube as a whole. After the pillar 20 is installed, a component of the articulated device at a top of the pillar 20 is connected to the component of the articulated device at the intersection to form a complete articulated device 10. An intelligent electric telescopic support rod 23 is bolted and fixed on the pillar 20 through a hoop 24. A component of an articulated device on a top of the intelligent electric telescopic support rod 23 is articulated with the hollow tube 5 on an east side or a west side to form a complete articulated 21. The intelligent electric telescopic support rod 23 is powered by the energy storage battery in the power box 2, as shown in FIG. 2. FIGS. 3 and 4 are top plan views of an assembled type thin-film solar power generating device, FIG. 1 refers to the movable support mode and FIG. 4 refers to the independent pillar support mode. When in store, the thin-film solar cells of the assembled type are in a scroll state. When in use, the thin-film solar cells re assembled into a polygonal shape with a same method as described in the above folded type.

Another Embodiment of the Present Invention

An inclination angle of the thin-film solar cells 1 or a solar cell panel 15 is adjusted according to time control. An adjustment method uses the driving device to rotate the thin-film solar cells 1 or the solar cell panel 15 1-dimensionally from east to west, thereby changing the inclination angle for tracking the sun. For adjusting the inclination angle of the thin-film solar cells 1 or the solar cell panel 15, the intelligent electric telescopic support rod 23 is used as the driving device in the independent pillar support mode, and the power box 2 installed with the driving motor and a transmission mechanism is used as the driving device in the movable support mode. In both modes, the inclination angle is adjusted according to change of time. which is adjusted three times within a day. Within a predetermined time, the driving motor in a base of the intelligent electric telescopic support rod 23 or in the power box 2 starts automatically, which optimize the inclination angle of the thin-film solar cells 1 with one move before automatically turning off. The thin-film solar cells 1 stand still during time periods of morning, noon and afternoon until the next time period when the driving motor restart. The time control is divided into three stages. The first stage is in the morning, wherein in the independent pillar support mode, the driving motor in the base of the intelligent electric telescopic support rod 23 is driven by an intelligent control system to shorten the intelligent electric telescopic support rod 23, in such a manner that the thin-film solar cells 1 turn to the east through the articulated device of the hollow tubes 5 of the frames of the thin-film solar cells 1; in the movable support mode, the driving motor in the power box 2 is started by the intelligent control system to drive the transmission mechanism, thereby rotating a driving shaft by an angle of a to the east, in such a manner that the thin-film solar cells 1 rotates by an angle of a with the T-shaped component 7 fixed on the rotating shaft to turn to the east. Similarly, the second stage is at noon, wherein in the independent pillar support mode, the intelligent electric telescopic support rod 23 extends, so that the thin-film solar cells 1 rotates to a horizontal state; in the movable support mode, the transmission mechanism is driven by the driving motor to rotate the driving shaft by an angle of negative a to the west, thereby adjusting the thin-film solar cells 1 to the horizontal state. The third stage is in the afternoon, wherein in the independent pillar support mode, the intelligent electric telescopic support rod 23 continues to extend to turn the thin-film solar cells 1 to the west; in the movable support mode, the driving motor drives the transmission mechanism to rotate the driving shaft by an angle of β to the west, thereby turning the thin-film solar cells 1 to the west.

INDUSTRIAL APPLICABILITY

The present invention provides a tracking type portable thin-film solar power generating device, which solves a technical problem of low power generation of conventional thin-film solar power generating device. Conventionally, commercially available thin-film solar power generating devices has no sun-tracking function, which are struggling in promotion and application in outdoor activity market due to small solar cell installed capacity, low power generation and low cost performance. According to the market needs, the present invention proposes a new solution to solve this technical problem well. The present invention has advantages of being convenient to carry, simple to operate, low in cost, large in power generation, and cost-effective, wherein with the same solar cell installed capacity, the power generation of the present invention is about 40% higher than that of the commercially available thin-film solar cells.

What is claimed is:

1. A tracking type portable thin-film solar power generating device, comprising: a movable support or a pillar, thin-film solar cells, a driving device, and hollow tubes; wherein the tracking type portable thin-film solar power generating device is a folded type thin-film solar power generating device or an assembled type thin-film solar power generating device; wherein the folded type thin-film solar power generating device divides a piece of portable foldable textile fabric with high temperature resistance, water resistance and corrosion resistance into M polygonal or circular grids, and each grids are provided with one of the thin-film solar cells; the M thin-film solar cells are connected in series or in parallel to form an integrated polygonal thin-film solar cell; wherein the assembled type thin-film solar power generation device is in a scroll state when in store; after the assembled type thin-film solar power generation device is expanded, F thin-film solar cells are assembled with each other to form a polygonal shape; the F thin-film solar cells are connected in series or in parallel to form an integrated polygonal thin-film solar cell; for the folded type or the assembled type thin-film solar power generating device, on a back side of the fabric, strip-like or button-like pockets or touch fasteners are sewn on edges of the fabric, and a length of each of the pockets or touch fasteners on the edges is consistent with an edge length; two strip-like or button-like pockets or touch fasteners are sewn in two diagonal directions; N strip-like or button-like pockets or touch fasteners are sewed in a latitudinal direction and a longitudinal direction, which are arranged in the latitudinal direction or the longitudinal direction from a center intersection thereof; a length of each of the strip-like or button-like pockets or touch fasteners in the latitudinal direction or the longitudinal direction is consistent with a corresponding edge length in the latitudinal direction or the longitudinal direction; lengths of the pockets or touch fasteners in the diagonal directions stop at adjacent pockets or touch fasteners of a middle pocket or touch fastener in the latitudinal direction or stop at corners of frames; there is no diagonal pockets in a movable support mode; for the assembled type thin-film solar power generating device, internal edges of two external thin-film solar cells in the longitudinal direction, which face other thin-film solar cells, are one of a male side or a female side of the touch fasteners; two edges of the other thin-film solar cells are one of the male side and the female sides of the touch fasteners; wherein the button-like pockets or touch fasteners have gaps between adjacent pockets or touch fasteners; the adjacent pockets or touch fasteners are not connected into a strip but are evenly distributed along an edge length direction; each end of the strip-like pockets has an opening; R hollow tubes are inserted into each of the strip-like or button-like pockets or touch fasteners; a cross section of the hollow tubes is circular or polygonal; both ends of the hollow tubes are bolt joints or nut joints, or one end is a bolt joint and the other end is a nut joint; when R>1, the R hollow tubes inserted to the strip-like or button-like pockets or touch fasteners are threaded together to form hollow tubes with a same length as the edges or diagonals; the hollow tubes of each frame are threaded together through connecting nuts; the connecting nuts comprises L-shaped nuts at corner joints and T-shaped nuts at linear joints; in the folded type or the assembled type thin-film solar power generating device, each of the hollow tubes at each frame has an opening between two ends; there are totally H joints for four frames, and the joints comprises penetrating joints and non-penetrating joints; if a joint of adjacent long and short edges in a southeast corner of the frames is a penetrating joint, then a joint of adjacent long and short edges in a northwest corner of the frames is a non-penetrating joint, and vice versa; in the folded type or the assembled type thin-film solar power generating device, after the hollow tubes on the back side of the fabric are bolted at intersections, one ends of the hollow tubes are inserted into the non-penetrating joints, and the other ends of the hollow tubes are inserted into the penetrating joints, so as to be bolted or threaded as well as integrated with the hollow tubes of the frames; wherein at the T-shaped nuts, the hollow tubes pass through the strip-like or button-like pockets or touch fasteners and threaded with vertical joints of the T-shaped nuts; in an independent pillar support mode of the folded type or the assembled type thin-film solar power generating device, a joint is provided at a middle of a hollow tube on an east side frame or a west side frame, or at a bottom of the T-shaped nut; a component of an articulated device is movably installed on the joint, which is articulated with a component of the articulated device at a top of the driving device to complete the articulated device; the hollow tubes at the two diagonals are bolted and integrated at an intersection; a bolt at the intersection articulates the pillar to form an articulated device, thereby mounting the integrated polygonal thin-film solar cell on the pillar; in the movable support mode of the folded type or the assembled type thin-film solar power generating device, referring to an intersection of diagonals of the integrated polygonal thin-film solar cell in the latitudinal direction and the longitudinal direction, three hollow tubes with a same length as the long edge of the frames are installed at the intersection and left and right adjacent sides thereof; a top end of a T-shaped component, which has an open ring at a bottom end, straddles and bolts with the three hollow tubes; the open ring at the bottom end of the T-shaped component covers and is bolted on a rotating shaft of a power box to fix the integrated polygonal thin-film solar cell on the rotating shaft; the driving device for driving the rotating shaft is installed in the power box; both ends of the hollow tubes are the bolt joints or the nut joints, or one end is the bolt joint and the other end is the nut joint; the driving device adjusts an inclination angle of the thin-film solar cells according to change of time; in the independent pillar support mode, the driving device uses an intelligent electric telescopic support rod for adjustment; in the movable support mode, the driving device uses a driving motor together with a transmission mechanism for adjustment; wherein the two support modes are adopted for different combination of the thin-film solar cells and the driving device, which jointly construct a simple and portable solar power generating device with a sun-tracking function; according to the different support modes, the driving device of different types is used to drive the thin-film solar cells according to a time control method, so as to change the inclination angle according to the time control method.

2. The tracking type portable thin-film solar power generating device, as recited in claim 1, wherein an intelligent electric telescopic rod device in the driving device comprises two types according to different transmission mechanisms; in a first type, the driving motor and the intelligent electric telescopic support rod are installed perpendicularly, and a worm gear is used as the transmission mechanism; in a second type, the driving motor and the intelligent electric telescopic support rod are installed parallelly, and a gear, a driving wheel or a belt is used as the transmission mechanism; internal structures of the first type and the second type of the intelligent electric telescopic rod device are identical except for the transmission mechanism; wherein the intelligent electric telescopic rod device comprises a base, the driving motor, the transmission mechanism, an angular contact bearing, a nut, a threaded screw rod, an inner sleeve, and an outer sleeve, wherein one end of the transmission mechanism is connected to the driving motor, and the other end of the transmission mechanism is connected to one end of the threaded screw rod; the outer sleeve and the angular contact bearing are fixed on the support or the base; the transmission mechanism is fixed in the base or the support; the driving motor is installed outside the outer sleeve and is parallel or perpendicular to the outer sleeve; the threaded screw rod passes through the angular contact bearing, and a bottom end of the threaded screw rod is connected to the transmission mechanism; the nut is sleeved on the threaded screw rod; a rod body of the intelligent electric telescopic support rod is formed by the inner sleeve with a same diameter and an accompanying socket; the inner sleeve is sleeved on the threaded screw rod, and the socket on a bottom of the inner sleeve is integrated with the nut to form a combination consisting of the inner sleeve with the same diameter, the threaded screw rod with the same diameter, and the nut; the threaded screw rod with the same diameter inside the rod body is precisely fitted together with the rod body through the nut and the socket, so as to rotate freely in the rod body to form a threaded motion pair; during working, the driving motor drives the transmission mechanism, thereby driving the threaded screw rod to synchronically rotate; rotary motion of the threaded screw rod is converted to linear motion of the rod body through the nut and socket, so as to extend and shorten the intelligent electric telescope support rod.

3. The tracking type portable thin-film solar power generating device, as recited in claim 2, wherein the power box has a groove, and sliding bearings are installed on both sides of the groove; the rotating shaft is installed in a middle of the groove and is supported by the sliding bearings on both sides; one end of the rotating shaft passes through the sliding bearings and is connected to the transmission mechanism in the driving device; the sliding beatings are fixed on a bracket in a box body of the power box; E holes are preset on a periphery of a bottom plate protruding from a bottom of the box body; each of the holes is bolted above a polygonal or circular support plate; a shell of the power box is equipped with a USB interface, output and input power interfaces and an LED light.

4. The tracking type portable thin-film solar power generating device, as recited in claim 3, wherein according to the time control method, the driving device intelligently drives the thin-film solar cells to rotate 1-dimensionally from east to west according to the change of time, thereby adjusting the inclination angle of the thin-film solar cells according to the change of time; the inclination angle of the thin-film solar cells is adjusted three times a day, and adjustment is divided into three states; a first stage adjusts the thin-film solar cells to the east in morning, a second stage adjusts the thin-film solar cells to be horizontal at noon, and a third stage adjusts the thin-film solar cells to the west in afternoon; in the independent pillar support mode, the inclination angle is adjusted by the intelligent electric telescopic support rod; in the movable support mode, the inclination angle is adjusted by the driving device in the power box.

\* \* \* \* \*